United States Patent
Chou et al.

(10) Patent No.: US 9,906,073 B1
(45) Date of Patent: Feb. 27, 2018

(54) POWER SUPPLY FOR REDUCING WORKING POWER LOSS

(71) Applicant: SEA SONIC ELECTRONICS CO., LTD., Taipei (TW)

(72) Inventors: Sheng-Chien Chou, Taipei (TW); Chih-Sheng Chang, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 0 days.

(21) Appl. No.: 15/628,217

(22) Filed: Jun. 20, 2017

(51) Int. Cl.
| | |
|---|---|
| *G05F 1/00* | (2006.01) |
| *H02J 1/10* | (2006.01) |
| *H02M 1/00* | (2006.01) |
| *H02J 9/06* | (2006.01) |
| *G06F 1/26* | (2006.01) |
| *H02M 7/00* | (2006.01) |
| *H01L 23/40* | (2006.01) |

(52) U.S. Cl.
CPC .............. *H02J 9/061* (2013.01); *G06F 1/263* (2013.01); *H01L 23/40* (2013.01); *H02M 7/003* (2013.01); *H01L 2224/32245* (2013.01); *H01L 2924/13091* (2013.01)

(58) Field of Classification Search
CPC ................ H02M 2001/0074; H02M 2001/008
USPC ........................ 323/271, 272; 363/65, 78, 79
See application file for complete search history.

(56) References Cited

U.S. PATENT DOCUMENTS

| | | | |
|---|---|---|---|
| 6,198,642 B1 * | 3/2001 | Kociecki | H02M 1/4225 307/150 |
| 2004/0130302 A1 * | 7/2004 | Ostojic | H02J 1/08 323/272 |
| 2005/0213354 A1 * | 9/2005 | Pai | H02M 3/156 363/21.06 |

FOREIGN PATENT DOCUMENTS

TW  I400603 B1  7/2013

* cited by examiner

*Primary Examiner* — Gary Nash
(74) *Attorney, Agent, or Firm* — Muncy, Geissler, Olds & Lowe, P.C.

(57) ABSTRACT

A power supply includes a first and second power conversion modules, changeover switch and control module. The first power conversion module provides at least one working power and generate a power good signal. The power conversion efficiency of the second power conversion module is lower than that of the first power conversion module. The second power conversion module provides a backup power permanently. The control module includes a switch control unit connected to the changeover switch, and a voltage drop adjustment unit connected to the second power conversion module. The control module is provided with a first state, in which the power good signal is not received such that the backup power is outputted continuously, and a second state, in which the changeover switch is turned on while the backup power is dropped to be replaced by the working power from the changeover switch on receiving the power good signal.

7 Claims, 5 Drawing Sheets

POWER SUPPLY FOR REDUCING WORKING POWER LOSS

FIELD OF THE INVENTION

The present invention is related to a power supply, particularly to a power supply having working power outputted in place of stationary power when power is supplied normally.

BACKGROUND OF THE INVENTION

Modern research on power supply is not only directed at the enhancement of power density of the power supply, but also devoted to the reduction of working loss of the power supply, as disclosed in Taiwan patent no. 1400603, the patent disclosing a power allocating apparatus used for a plurality of power supply modules, each power supply module being coupled to a plurality of loads via a plurality of power lines, respectively. The power allocating apparatus includes a first switch element, a second switch element and a control device. The first switch element is provided with a first connecting terminal and a second connecting terminal coupled to an output terminal of a power supply module with a relatively high conversion efficiency and an output terminal of a power supply module with a relatively low conversion efficiency, respectively, in the plurality of power supply modules, and allowed to selectively allocate a power generated by the power supply module with the relatively high conversion efficiency to a predetermined number of loads simultaneously according to on or off states. The second switch element is coupled between the output terminal of the power supply module with the relatively low conversion efficiency and the second connecting terminal of the first switch element, in which the second switch element is not conductive when the first switch element is conductive. Moreover, the control device is coupled to the first switch element for generating the control signal to control the first switch element to enter an on state or an off state.

It is known from the brief description and figures of that patent, the diode is used as the switch element in that patent. Nevertheless, the diode is turned on only when obvious voltage difference between positive and negative terminals of the diode appears (due to forward-bias of 0.7V of the diode). However, the voltage outputted from the power supply module with the relatively high conversion efficiency used in place of the power supply module with the relatively low conversion efficiency is the same as that outputted from the power supply module with the low conversion efficiency; that is to say, 5V of the power supply module with the relatively high conversion efficiency is used in place of $5V_{SB}$ outputted from the power supply module with the relatively low conversion efficiency. Therefore, the output of the power supply module with the relatively high conversion efficiency being used in place of that of the power supply module with the relatively low conversion efficiency is not ensured by the technology proposed in that patent.

SUMMARY OF THE INVENTION

It is the main object of the present invention to solve the problem caused in the prior art.

For achieving the above object, the present invention provides a power supply connected to an external power source so as to obtain an external power. The power supply includes a first power conversion module, a second power conversion module, a changeover switch and a control module. The first power conversion module is provided with at least one first output terminal. After the first power conversion module is enabled, the external power is converted into at least one working power, which is then provided via the first output terminal, and a power good signal is generated thereby. The power conversion efficiency of the second power conversion module is lower than that of the first power conversion module, and the second power conversion module is provided with a second output terminal. After the external power is obtained by the second power conversion module in the power supply, the external power is converted permanently and then provided as a backup power via the second output terminal. The changeover switch is connected between the first output terminal and the second output terminal. The control module includes a switch control unit connected to the changeover switch, and a voltage drop adjustment unit connected to the second power conversion module. The control module is provided with a first state, in which the switch control unit is not allowed to turn on the changeover switch when the power good signal is not received such that the backup power is outputted continuously, and a second state, in which the switch control unit is allowed to turn on the changeover switch while activate the voltage drop adjustment unit when the power good signal is received such that the backup power outputted from the second power conversion module is dropped so as to be replaced by the working power transmitted from the changeover switch.

In one embodiment, the second power conversion module includes a feedback control unit, and the voltage drop adjustment unit is connected to the feedback control unit. The voltage drop adjustment unit is allowed to change a feedback control signal of the feedback control unit on receiving the power good signal in the second state, such that the power level of the backup power outputted from the second power conversion module later is reduced.

In one embodiment, the first power conversion module is provided with a first auxiliary power unit. The second power conversion module is provided with a second auxiliary power unit connected to the first auxiliary power unit. Zero output is provided by the second auxiliary power unit in the second state. Power is outputted to a power load of the second auxiliary power unit from the first auxiliary power unit in the second state, so as to replace power outputted from the second auxiliary power unit.

In one embodiment, the first power conversion module includes the plurality of first output terminals used for outputting the working power at different power levels, respectively. The changeover switch is then connected to one of the first output terminals, the power level of which is the same as that of the backup power. Furthermore, the power level of the backup power is 5V, 12V or 3.3V.

In view of implementation disclosed in the foregoing of the present invention, there are features, in comparison with the prior art, as follows.

In the present invention, when the control module is brought into the second state, the working parameter of the second power conversion module is changed by the voltage drop adjustment unit. Thereby, the power level of the backup power outputted from the second power conversion module in the second state is lower than that in the first state, so as to ensure the working power outputted from the first power conversion module being transmitted to the second output terminal through the changeover switch for replacing the backup power. Thus, zero output is provided by the second power conversion module at this moment, and overall loss of the power supply may be then reduced.

DETAILED DESCRIPTION OF THE PREFERRED EMBODIMENTS

The detailed description and technical content of the present invention will now be described in conjunction with drawings as follows.

Figure 1:
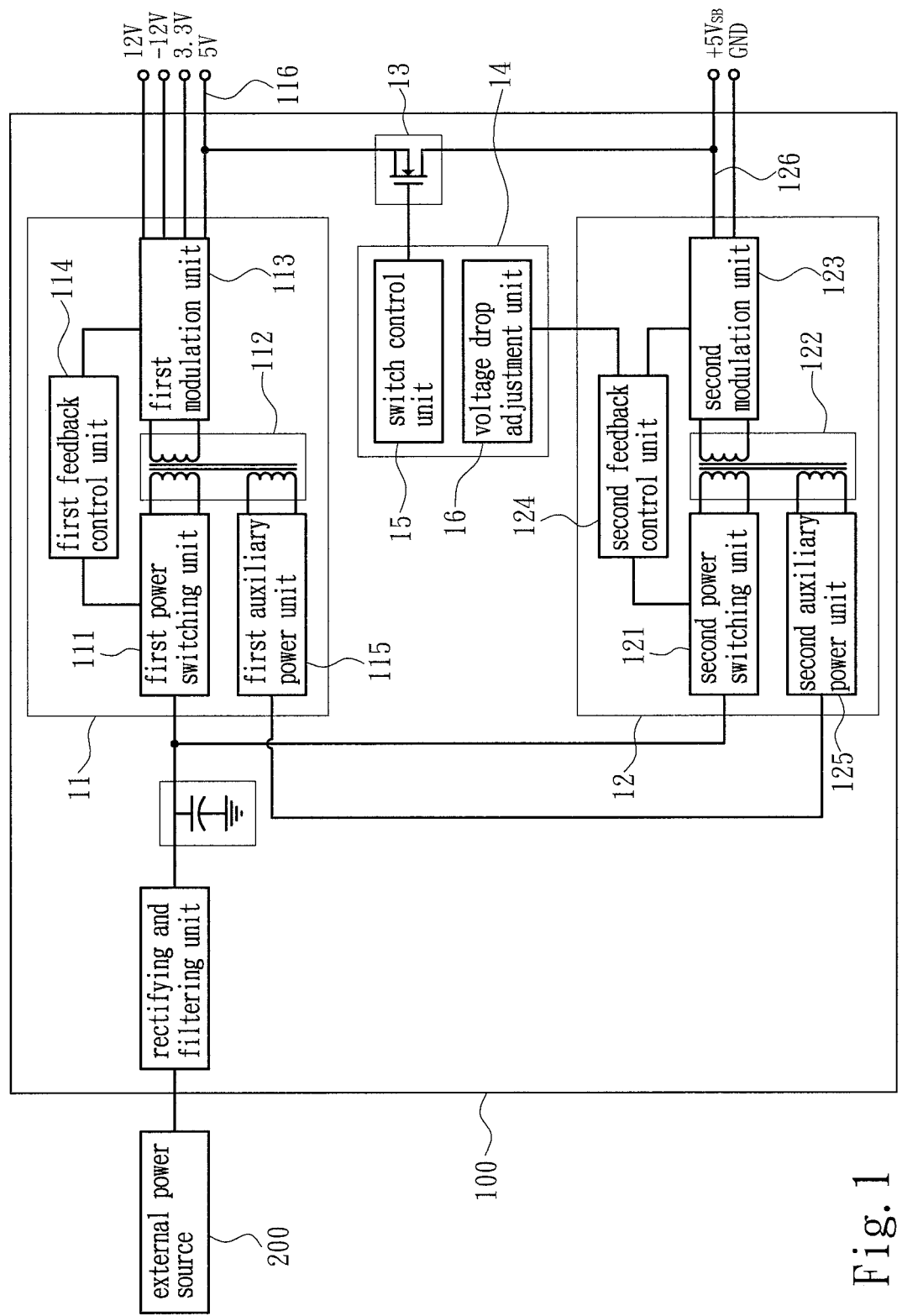
FIG. 1 is a diagram illustrating a power supply unit of one embodiment of the present invention.

Referring to FIG. 1, the present invention provides a power supply 100. During the power supply 100 is put into practice, the power supply is connected to an external power source 200 so as to obtain an external power. Moreover, the power supply 100 is researched and produced in accordance with Advanced Technology Extended (ATX) specification defined by Intel Corporation. The power supply 100 includes a first power conversion module 11, a second power conversion module 12, a changeover switch 13 and a control module 14. In this case, the first power conversion module 11 is constructed by a plurality of electronic elements. The first power conversion module 11 may be designed on the basis of an existing switching type power conversion circuit. Further, the first power conversion module 11 is provided with a first power switching unit 111, a first transformer 112 connected to the first power switching unit 111, a first modulation unit 113 connected to the first transformer 112, a first feedback control unit 114 respectively connected to the first power switching unit 111 and the first modulation unit 113, and a first auxiliary power unit 115. In this case, the first power switching unit 111 and the first auxiliary power unit 115 are provided on the primary side of the first transformer 112, while the first modulation unit 113 is provided on the secondary side. The first transformer 112 is then allowed to convert the power, transmitted from the first power switching unit 111, in accordance with the turn ratio designed when the first transformer 112 is wound. The modulation unit 113 is then directed at modulation, rectification, and filtration of power level of the power, outputted from the first transformer 112, and subsequently allowed to output the power. Moreover, the first feedback control unit 114 is allowed to convert the working state of the first modulation unit 113 into a feedback control signal, sent to the first power switching unit 111, such that the first power switching unit 111 may be adjusted moderately along with the working state of the first modulation unit 113. Moreover, the first auxiliary power unit 115 is used for powering circuits pertaining to the primary side of the first power switching unit 111 and first power conversion module 11, in such a way that power, obtained by the circuits receiving the power from the first auxiliary power unit 115, may be used for initial activation or maintaining normal operation after activation for the circuits.

Furthermore, the first power conversion module 11 is provided with at least one first output terminal 116. When the first power conversion module 11 is enabled on receiving a power supply on signal (also called Ps_on signal) transmitted from a load (not shown in this figure) in the power supply 100, the external power is converted into at least one working power by the enabled first power conversion module 11, and the working power is then outputted to the load via the first output terminal 116. After normal activation, moreover, a power good signal is generated by the first power conversion module 11. The power good signal may be transmitted to the load through an information transmission line by the power supply 100, such that the powering condition of the power supply 100 may be determined by the load in accordance with the power good signal. In one embodiment, the first power conversion module 11 is designed in accordance with ATX specification, and allowed for generating a plurality of working power supplies after enabled. The working power at least includes external power at 12V, −12V, 5V and 3.3V. In this embodiment, moreover, the first power conversion module 11 includes a plurality of first output terminals 116, each transmitting one working power individually.

On the other hand, the second power conversion module 12 may be also designed in accordance with an existing switching type power conversion circuit. The power conversion efficiency of the second power conversion module 12 is lower than that of the first power conversion module 11. After the external power is obtained by the second power conversion module 12 in the power supply 100, the external power is converted into a backup power permanently thereby. The backup power is provided for the permanent circuit of the load to work continuously even though the load is not activated yet. The second power conversion module 12 is provided with a second power switching unit 121, a second transformer 122 connected to the second power switching unit 121, a second modulation unit 123 connected to the second transformer 122, a second feedback control unit 124 respectively connected to the second power switching unit 121 and the second modulation unit 123, a second auxiliary power unit 125, and a second output terminal 126. In this case, the concept of operation of the second power switching unit 121, the second transformer 122, the second modulation unit 123 and the second feedback control unit 124 is the same as that of the first power switching unit 111, the first transformer 112, the first modulation unit 113 and the first feedback control unit 114 pertaining to the first power conversion module 11, and should not be repeated herein. Furthermore, the second auxiliary power unit 125 is further connected to the first auxiliary power unit 115, besides providing power, necessary for initial activation or maintaining normal operation of circuit after activation, for other electronic elements pertaining to the second power switching unit 121 and the second power conversion module 12. Thereby, the second auxiliary power unit 125 is allowed for powering the first auxiliary power unit 115, while the second auxiliary power unit 125 is allowed for outputting the backup power permanently in the second power conversion module 12, such that the first auxiliary power unit 115 is capable of providing power, necessary for activation, for the first power switching unit 111. Further, the object to be powered by the second auxiliary power unit 125 is defined as a power load of the second auxiliary power unit 125 in the present invention, as well as the power load may be referred to the element as described specifically and should not be repeated herein.

In addition, the power level of the backup power, as mentioned in the present invention, is 5V, 12V or 3.3V.

Figure 2:
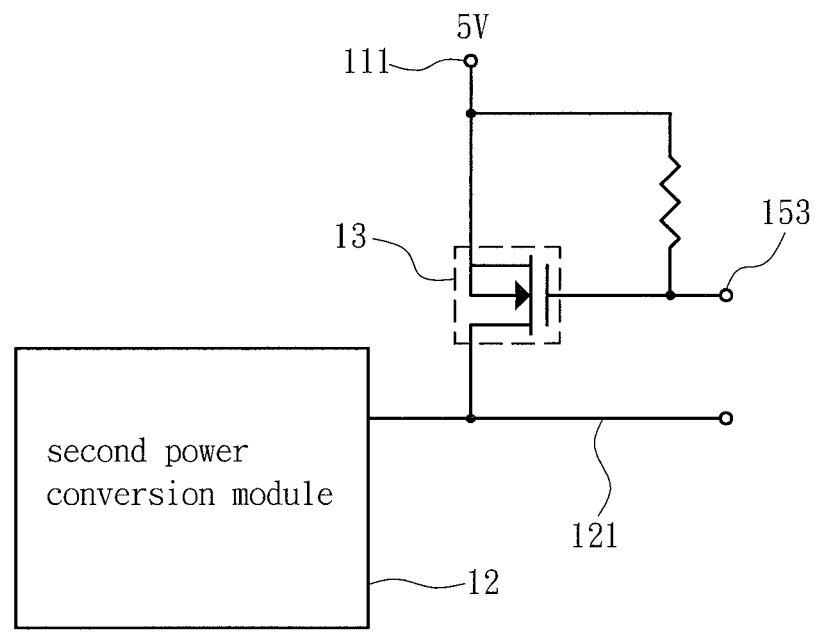
FIG. 2 is a partial circuit diagram of one embodiment of the present invention.
Figure 3:
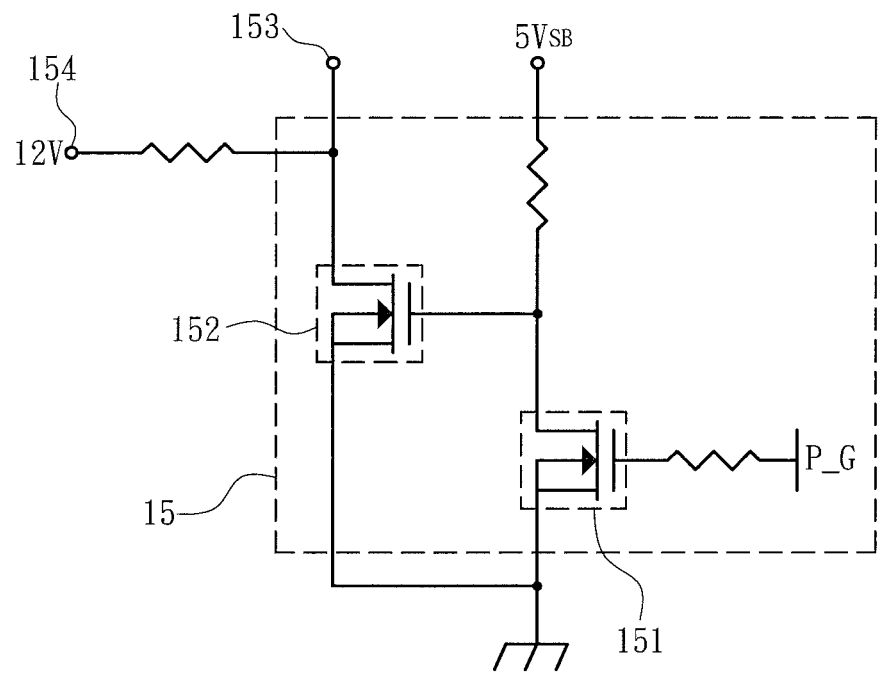
FIG. 3 is a circuit diagram of a switch control unit of one embodiment of the present invention.

Subsequently, referring to FIG. 2 together, the changeover switch 13 is connected between the first output terminal 116 and the second output terminal 126. The changeover switch 13 may be a bipolar junction transistor (BJT) or a metal-oxide-semiconductor field effect transistor (MOSFET). Furthermore, when the first power conversion module 11 is provided with a plurality of first output terminals 116, the changeover switch 13 is provided at one of the plurality of first output terminals 116, the power level of the working power outputted from which is the same as that of the backup power. For instance, the changeover switch 13 is provided at one of the plurality of first output terminals 116, which is used for outputting the working power of 5V, because the power level of the backup power is 5V. Moreover, the control module 14 includes a switch control unit 15 connected to the changeover switch 13, and a voltage drop adjustment unit 16 connected to the second power conversion module 12. Furthermore, the switch control unit 15 may be constructed by a plurality of switch elements 151, 152. The switch control unit 15 is provided with a signal output terminal 153 connected to the changeover switch 13, as illustrated in FIG. 3. The change in the signal output terminal 153 is provided for controlling on-off of the changeover switch 13. More specifically, after the power good signal P_G is received, the switch elements 151, 152 of the switch control unit 15 are turned on and off in succession, and finally, the voltage at the signal output terminal 153 may be changed by a voltage source 154 connected to the switch control unit 15, such that the changeover switch 13 is turned on.

Figure 4:
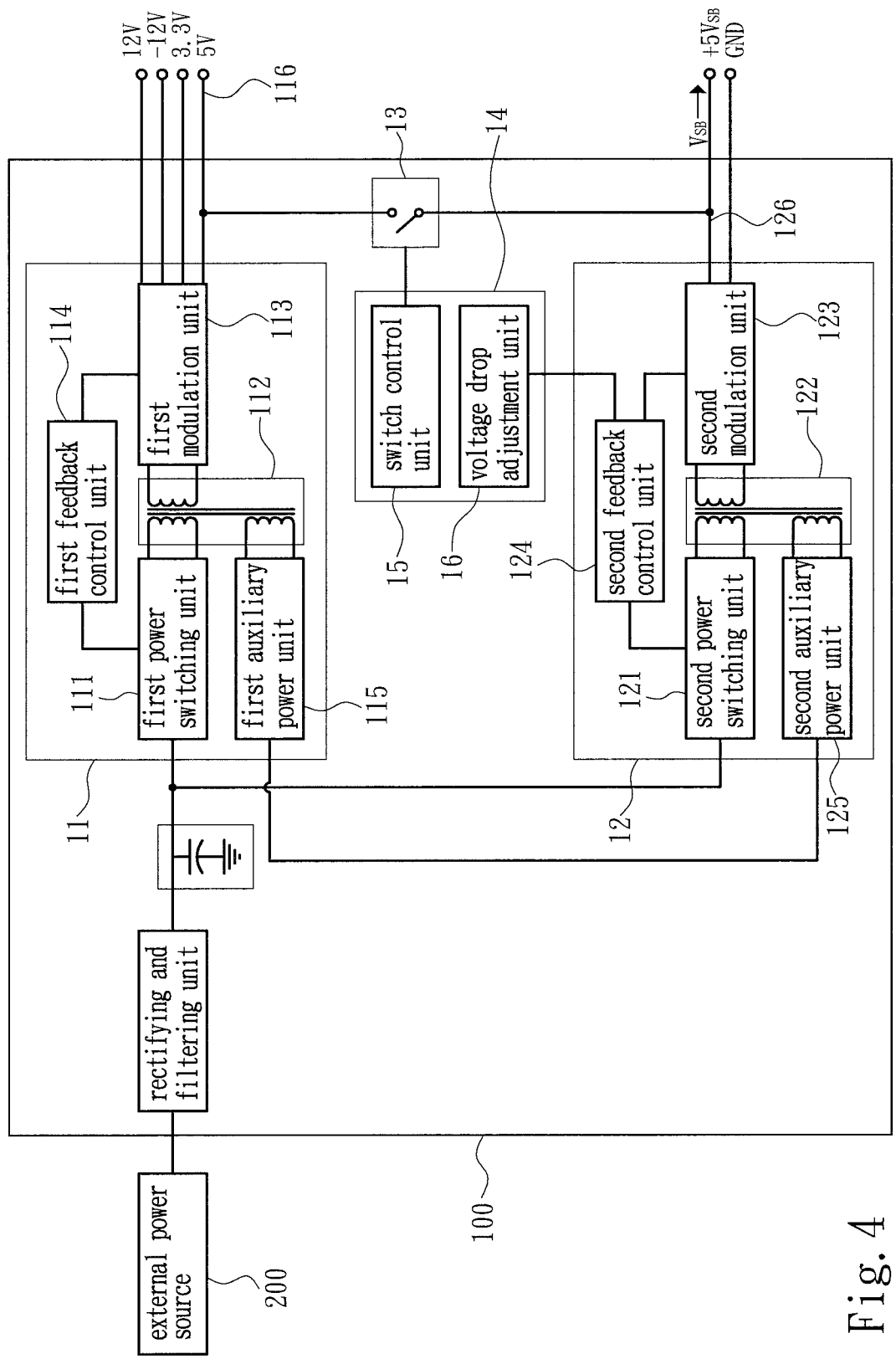
FIG. 4 is a diagram illustrating the implementation of a first state of one embodiment of the present invention.
Figure 5:
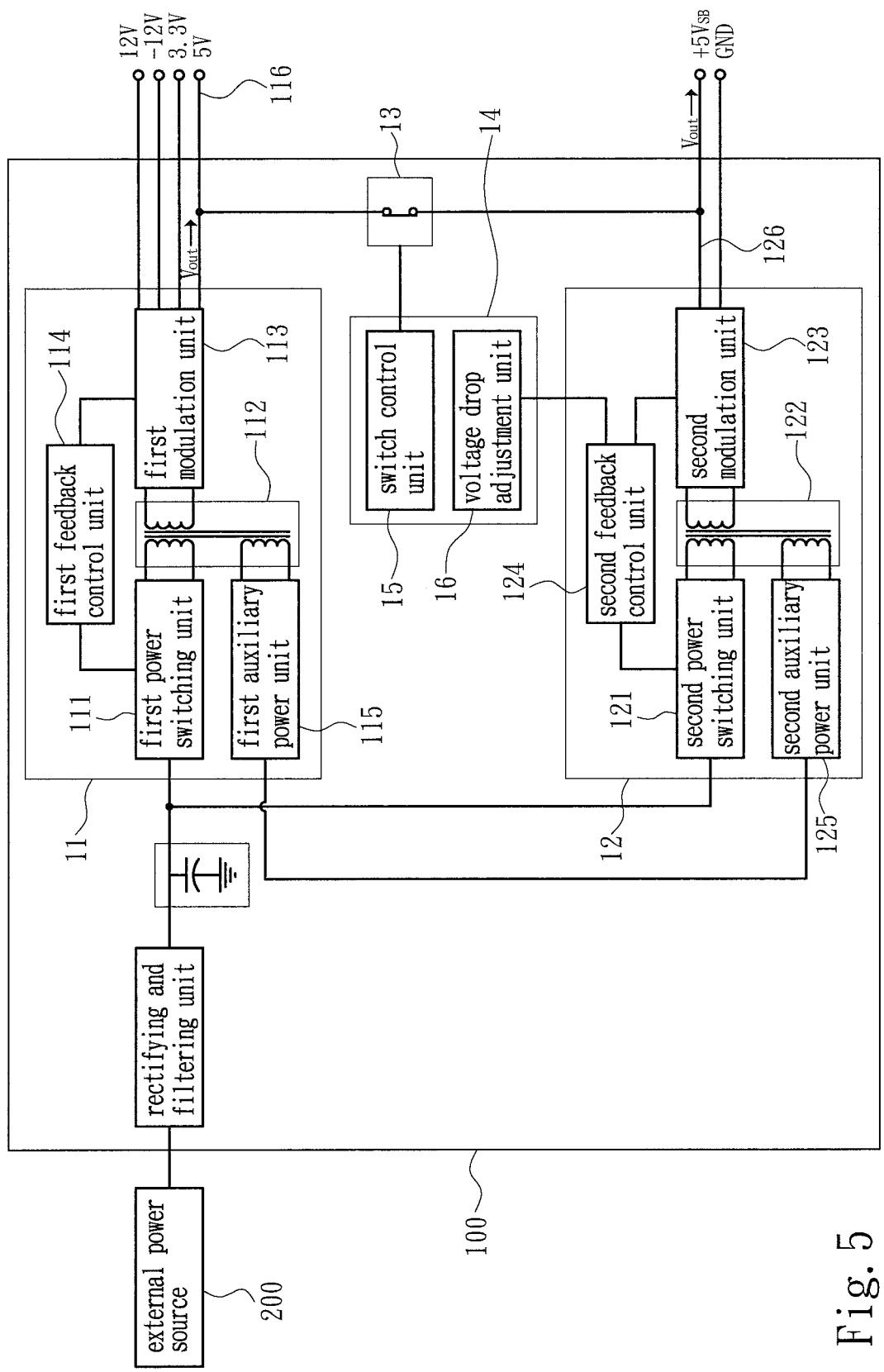
FIG. 5 is a diagram illustrating the implementation of a second state of one embodiment of the present invention.
Figure 6:
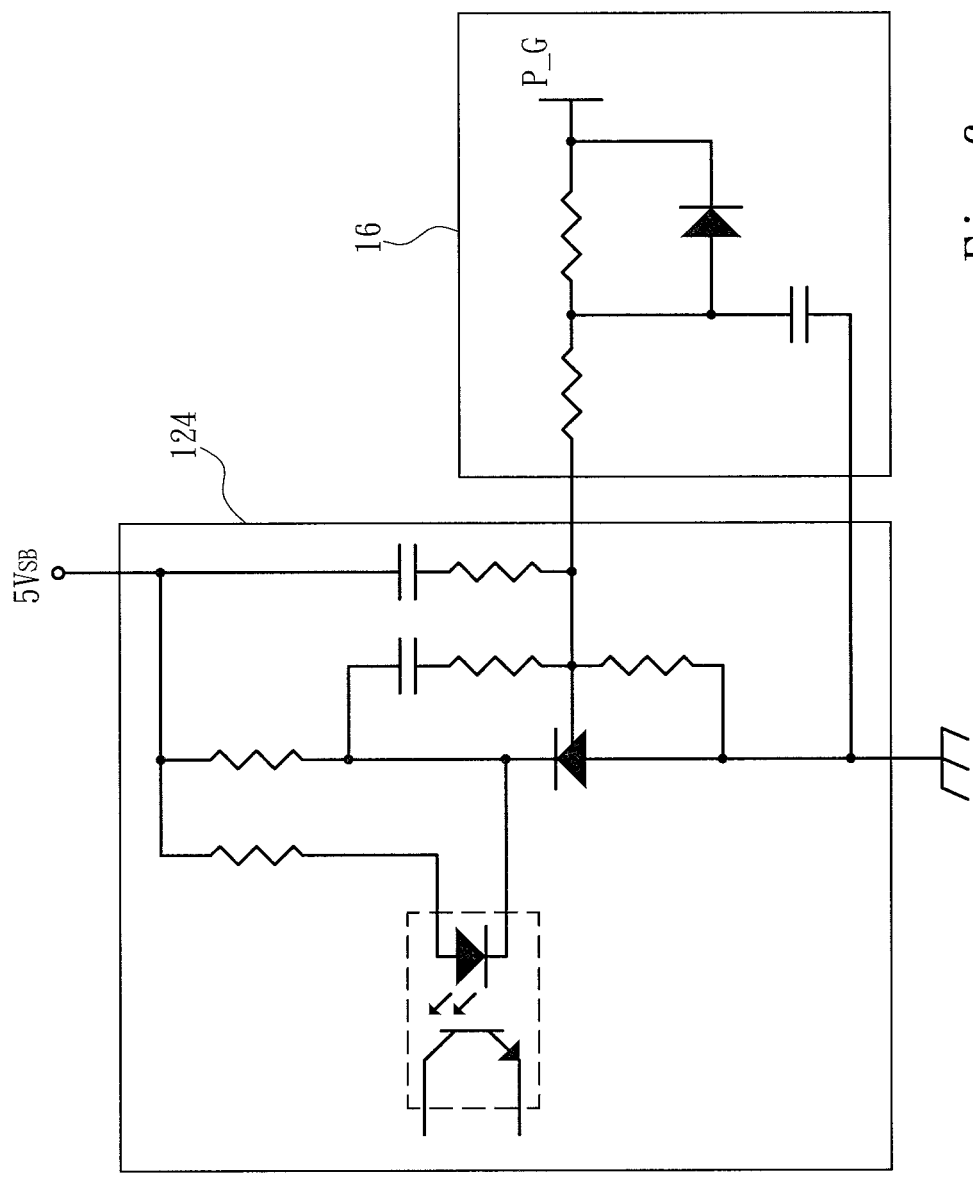
FIG. 6 is a partial circuit diagram including a voltage drop adjustment unit of one embodiment of the present invention.

Referring to FIGS. 4 to 6 together, the control module 14 is provided with a first state, in which the switch control unit 15 is not allowed to turn on the changeover switch 13 when the power good signal is not received such that the backup power is outputted continuously, and a second state, in which the switch control unit 15 is allowed to turn on the changeover switch 13 while activate the voltage drop adjustment unit 16 when the power good signal is received such that the backup power outputted from the second power conversion module 12 is dropped so as to be replaced by the working power transmitted from the changeover switch 13. More specifically, it is firstly assumed that the power supply 100 is just connected to the external power source 200 so as to be situated in an inactivated state. The first power conversion module 11 is not enabled because the power supply on signal is not received, and the power good signal is not generated by the first power conversion module 11. At this time, the switch control unit 15 is not allowed to turn on the changeover switch 13 because the power good signal could not be received. In this way, the backup power is maintained to be outputted for the load via the second output terminal 126. Furthermore, when the power supply 100 is assumed to receive the power supply on signal transmitted from the load and thus enter an activated state, the first power conversion module 11 will be allowed to generate the power good signal, besides providing the working power for the load via the first output terminal 116, after the activation procedure is finished, and bring the control module 14 into the control procedure of the second state. At this time, the switch control unit 15 is allowed to turn on the changeover switch 13, i.e., short-circuiting the first output terminal 116 connected to the changeover switch 13 with the second output terminal 126, after the power good signal is received. In the meantime, the voltage drop adjustment unit 16 is also activated because the power good signal is received. The control factor for the second power conversion module 12 is changed by the voltage drop adjustment unit 16, such that the power level of the backup power outputted from the second power conversion module 12 later is lower than that in the first state. For instance, when the control module 14 is situated in the first state, the power level of the backup power and a feedback control signal generated by the second feedback control unit 124 are both situated at 5V identically. Nevertheless, in the second state, the second feedback control unit 124 is interfered with the voltage drop adjustment unit 16 so as to generate a different feedback control signal, such that the power level of the backup power is dropped to 3V. Afterwards, the working power is fed into the second output terminal 126, such that the power level of the backup power of the second power conversion module 12 is higher than that of the feedback control signal. The second power switching unit 121 is stopped from working by the second feedback control unit 124, and thus the working power is outputted, in place of the backup power, to the load. In this way, zero output is provided by the second power conversion module 12, and thus the overall efficiency of the power supply 100 may be increased without too much unnecessary loss produced by the power supply 100 due to the zero output of the second power conversion module 12, after the first power conversion module 11 in the power supply 100 is activated for powering (i.e., the control module 14 is brought into the second state).

In the former embodiment, furthermore, when the voltage drop adjustment unit 16 is activated on receiving the power good signal in the second state, the feedback control signal generated by the second feedback control unit 124 is changed by the voltage drop adjustment unit 16, such that the power level of the backup power outputted from the second power conversion module 12 later is reduced. In the second state, furthermore, zero output of the second auxiliary power unit 125 is also resulted from the zero output of the second power conversion module 12, such that power transmitted from the second auxiliary power unit 125 is replaced by that from the first auxiliary power unit 115, due to the comparison of the zero output of the second auxiliary power unit 125 with power output from the first power conversion module 11. Thereby, power is outputted to the power load of the second auxiliary power unit 125 from the first auxiliary power unit 115. In this way, the overall efficiency of the power supply 100 may be further enhanced owing to neither output of the second power conversion module 12, nor standby dissipation produced by the second auxiliary power unit 125.

What is claimed is:
1. A power supply connected to an external power source so as to obtain an external power, said power supply comprising:
   a first power conversion module provided with at least one first output terminal, after said first power conversion module being enabled, said external power being converted into at least one working power, which is then provided via said first output terminal, and a power good signal being generated thereby;
   a second power conversion module, the power conversion efficiency of which is lower than that of said first power conversion module, said second power conversion module being provided with a second output terminal, after said external power being obtained by said second power conversion module in said power supply, said external power being converted permanently and then provided as a backup power via said second output terminal;
   a changeover switch, connected between said first output terminal and said second output terminal; and
   a control module, including a control unit connected to said changeover switch, and a voltage drop adjustment unit connected to said second power conversion module, said control module being provided with a first state, in which said control module is not allowed to turn on said changeover switch when said power good signal is not received such that said backup power is outputted continuously, and a second state, in which said control module is allowed to turn on said changeover switch while activate said voltage drop adjustment unit when said power good signal is received such that said backup power outputted from said second power conversion module is dropped so as to be replaced by said working power transmitted from said changeover switch.

2. The power supply according to claim 1, wherein said second power conversion module comprises a feedback control unit, and said voltage drop adjustment unit is connected to said feedback control unit, said voltage drop adjustment unit being allowed to change a feedback control signal of said feedback control unit on receiving said power good signal in said second state, such that the power level of said backup power outputted from said second power conversion module later is reduced.

3. The power supply according to claim 2, wherein said first power conversion module is provided with a first auxiliary power unit, and said second power conversion module is provided with a second auxiliary power unit connected to said first auxiliary power unit, zero output being provided by said second auxiliary power unit in said second state, power being outputted to a power load of said second auxiliary power unit from said first auxiliary power unit in said second state so as to replace power outputted from said second auxiliary power unit.

4. The power supply according to claim 3, wherein said first power conversion module comprises said plurality of first output terminals used for outputting said working power at different power levels, respectively, and said changeover switch is then connected to one of said first output terminals, the power level of which is the same as that of said backup power.

5. The power supply according to claim 4, wherein the power level of said backup power is 5V, 12V or 3.3V.

6. The power supply according to claim 3, wherein the power level of said backup power is 5V, 12V or 3.3V.

7. The power supply according to claim 1, wherein said first power conversion module comprises said plurality of first output terminals used for outputting said working power at different power levels, respectively, and said changeover switch is then connected to one of said first output terminals, the power level of which is the same as that of said backup power.

* * * * *